(12) United States Patent
Qi et al.

(10) Patent No.: US 11,257,995 B2
(45) Date of Patent: Feb. 22, 2022

(54) OPTICAL MODULATING DEVICE, BACK LIGHT MODULE, DISPLAY APPARATUS, AND FABRICATING METHOD THEREOF

(71) Applicants: BOE Technology Group Co., Ltd., Beijing (CN); Beijing BOE Display Technology Co., Ltd., Beijing (CN)

(72) Inventors: Yonglian Qi, Beijing (CN); Lianjie Qu, Beijing (CN); Hebin Zhao, Beijing (CN); Bingqiang Gui, Beijing (CN); Xianxue Yang, Beijing (CN); Shuai Liu, Beijing (CN); Guangdong Shi, Beijing (CN)

(73) Assignees: BOE Technology Group Co., Ltd., Beijing (CN); Beijing BOE Display Technology Co., Ltd., Beijing (CN)

( * ) Notice: Subject to any disclaimer, the term of this patent is extended or adjusted under 35 U.S.C. 154(b) by 350 days.

(21) Appl. No.: 16/080,592

(22) PCT Filed: Mar. 20, 2018

(86) PCT No.: PCT/CN2018/079593
§ 371 (c)(1),
(2) Date: Aug. 28, 2018

(87) PCT Pub. No.: WO2019/052140
PCT Pub. Date: Mar. 21, 2019

(65) Prior Publication Data
US 2020/0052170 A1 Feb. 13, 2020

(30) Foreign Application Priority Data
Sep. 18, 2017 (CN) .......................... 201710840999.4

(51) Int. Cl.
*H01L 33/60* (2010.01)
*F21V 8/00* (2006.01)
*G02F 1/13357* (2006.01)

(52) U.S. Cl.
CPC ............ *H01L 33/60* (2013.01); *G02B 6/0055* (2013.01); *G02B 6/0065* (2013.01); *G02F 1/133603* (2013.01); *H01L 2933/0058* (2013.01)

(58) Field of Classification Search
CPC ..... H01L 33/60; G02B 6/0055; G02B 6/0065; G02F 1/133603
See application file for complete search history.

(56) References Cited

U.S. PATENT DOCUMENTS

2001/0040742 A1* 11/2001 Sejkora ............... F21V 5/02
359/837
2002/0159270 A1* 10/2002 Lynam ................ B60Q 1/2665
362/492
(Continued)

FOREIGN PATENT DOCUMENTS

| CN | 101203116 B | 8/2010 |
| CN | 102694109 A | 9/2012 |

(Continued)

OTHER PUBLICATIONS

First Office Action in the Chinese Patent Application No. 201710840999.4, dated Jul. 16, 2019; English translation attached.
(Continued)

*Primary Examiner* — Rajarshi Chakraborty
*Assistant Examiner* — Nathaniel J Lee
(74) *Attorney, Agent, or Firm* — Intellectual Valley Law, P.C.

(57) ABSTRACT

The present application provides an optical modulating device having a light transmissive region and a light block-
(Continued)

ing region. The optical modulating device includes a base substrate; a plurality of protrusions on the base substrate in the light transmissive region and configured to allow light emitting out of a side of the optical modulating device; and a reflective layer on the base substrate in the light blocking region and configured to block light from emitting out of the side of the optical modulating device.

16 Claims, 9 Drawing Sheets

(56) References Cited

U.S. PATENT DOCUMENTS

| | | | |
|---|---|---|---|
| 2007/0248714 A1 | 10/2007 | Dean et al. | |
| 2008/0253132 A1* | 10/2008 | Urabe | G02B 17/006 362/327 |
| 2012/0008067 A1 | 1/2012 | Mun et al. | |
| 2012/0248483 A1 | 10/2012 | Beppu et al. | |
| 2014/0098566 A1* | 4/2014 | Starkey | G02B 5/0221 362/611 |
| 2014/0301109 A1 | 10/2014 | Kim et al. | |
| 2015/0160402 A1* | 6/2015 | Kim | B29D 11/00663 362/613 |
| 2015/0370016 A1 | 12/2015 | Kurizoe et al. | |
| 2016/0316180 A1* | 10/2016 | Han | G02B 13/0055 |
| 2016/0363708 A1* | 12/2016 | You | G02B 6/005 |

FOREIGN PATENT DOCUMENTS

| | | |
|---|---|---|
| CN | 202583691 U | 12/2012 |
| CN | 103185294 A | 7/2013 |
| CN | 104076419 A | 10/2014 |
| CN | 204114616 U | 1/2015 |
| CN | 104937462 A | 9/2015 |
| CN | 105141725 A | 12/2015 |
| CN | 106597599 A | 4/2017 |
| CN | 107042477 A | 8/2017 |
| JP | 2003500687 A | 1/2003 |
| JP | 2008249785 A | 10/2008 |
| KR | 20150041551 A | 4/2015 |
| WO | 2015115046 A1 | 8/2015 |

OTHER PUBLICATIONS

International Search Report & Written Opinion dated Jun. 20, 2018, regarding PCT/CN2018/079593.
Third Office Action in the Chinese Patent Application No. 201710840999.4, dated Jul. 1, 2020; English translation attached.
Second Office Action in the Chinese Patent Application No. 201710840999.4, dated Feb. 21, 2020 English translation attached.
Extended European Search Report in the European Patent Application No. 18762442.4, dated May 6, 2021.
First Office Action in the Japanese Patent Application No. 2018564782, dated Dec. 7, 2021; English translation attached.

* cited by examiner forming a light transmission layer having a base substrate and a plurality of protrusions on the base substrate, the plurality of protrusions being a plurality of nanoscale protrusions spaced apart from each other and being light transmissive

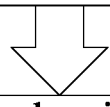

forming an insulating layer having a plurality of insulating blocks, each of which on a side of one of the plurality of protrusions distal to the base substrate

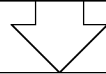

forming a reflective layer on the base substrate in a region outside the plurality of insulating blocks

FIG. 6 forming a replication master layer on a second base substrate, the replication master layer is formed to include a plurality of replication masters corresponding to the plurality of protrusions to be formed in the optical modulating device

↓ forming a conductive surface on an exposed surface of the replication master layer and the second base substrate

↓ forming a metal layer on the conductive surface

↓ separating the metal layer from the replication master layer and the second base substrate, thereby forming a mold

↓ providing a light transmission main body

↓ embossing the light transmission main body using the mold, thereby forming a light transmission layer having a plurality of protrusions on a base substrate, and a plurality of recesses, each of which on a side of one of the plurality of protrusions distal to the base substrate

↓ forming a conductive surface on an exposed surface of the light transmission layer on a side having the plurality of protrusions on the base substrate

↓ printing an ink in the plurality of recesses on a side of the plurality of protrusions distal to the base substrate

↓ curing the ink in the plurality of recesses on a side of the plurality of protrusions distal to the base substrate, thereby forming the insulating layer having a plurality of insulating blocks, each of which in one of the plurality of recesses

↓ electrodepositing a reflective material on the base substrate in a region outside the plurality of insulating blocks thereby forming a reflective layer

FIG. 7

OPTICAL MODULATING DEVICE, BACK LIGHT MODULE, DISPLAY APPARATUS, AND FABRICATING METHOD THEREOF

CROSS-REFERENCE TO RELATED APPLICATION

This application is a national stage application under 35 U.S.C. § 371 of International Application No. PCT/CN2018/079593, filed Mar. 20, 2018, which claims priority to Chinese Patent Application No. 201710840999.4, filed Sep. 18, 2017, the contents of which are incorporated by reference in the entirety.

TECHNICAL FIELD

The present invention relates to display technology, more particularly, to a back light module, a display apparatus, and a method of fabricating an optical modulating device.

BACKGROUND

Typically, a back light module is required in a liquid crystal display apparatus. The back light module includes one or more light sources and a light guide plate for receiving light from the one or more light sources and guiding the light along a transmission direction. The light guide plate enhances the brightness and ensures the light is evenly distributed in a display panel. Typically, a light guide plate includes numerous light guide points (a.k.a., light guide pattern or light guide dots), which disrupt light total reflection locally and reflect light into the display panel along a direction perpendicular to the incident light direction.

SUMMARY

In one aspect, the present invention provides an optical modulating device having a light transmissive region and a light blocking region, comprising a base substrate; a plurality of protrusions on the base substrate in the light transmissive region and configured to allow light emitting out of a side of the optical modulating device; and a reflective layer on the base substrate in the light blocking region and configured to block light from emitting out of the side of the optical modulating device.

Optionally, each of the plurality of protrusions has a first surface on which the reflective layer is absent and a second surface on which the reflective layer is present; the second surface connecting the first surface with the base substrate; the first surface is in the light transmissive region; and the second surface is in the light blocking region.

Optionally, an orthographic projection of the plurality of protrusions on the base substrate is at least partially non-overlapping with an orthographic projection of the reflective layer on the base substrate; and an orthographic projection of the first surface of the plurality of protrusions on the base substrate is substantially non-overlapping with the orthographic projection of the reflective layer on the base substrate.

Optionally, the optical modulating device further comprises a plurality of recesses in the light transmissive region, each of which on a side of one of the plurality of protrusions distal to the base substrate; wherein an orthographic projection of the plurality of recesses on the base substrate is substantially non-overlapping with an orthographic projection of the reflective layer on the base substrate.

Optionally, the optical modulating device further comprises an insulating layer on a side of the plurality of protrusions distal to the base substrate; wherein the insulating layer comprises a plurality of insulating blocks, each of which in one of the plurality of recesses and in the light transmissive region.

Optionally, the base substrate and the plurality of protrusions are formed as an integral light transmission layer.

Optionally, the plurality of protrusions are a plurality of nanoscale protrusions.

Optionally, the optical modulating device is a light guide plate.

In another aspect, the present invention provides a back light module comprising the optical modulating device described herein and one or more light sources.

In another aspect, the present invention provides a display apparatus comprising the back light module described herein.

In another aspect, the present invention provides a method of fabricating an optical modulating device having a light transmissive region and a light blocking region, comprising forming a light transmission layer comprising a plurality of protrusions on a base substrate in the light transmissive region and configured to allow light emitting out of a side of the plurality of protrusions; and forming a reflective layer on the base substrate in the light blocking region and configured to block light from emitting out of the light transmission layer.

Optionally, prior to forming the reflective layer, further comprising forming an insulating layer having a plurality of insulating blocks, each of which on a side of one of the plurality of protrusions distal to the base substrate.

Optionally, forming the reflective layer comprises forming a reflective material layer on the base substrate in a region outside the plurality of insulating blocks.

Optionally, forming the reflective layer comprises forming a reflective material layer throughout the light transmission layer, the reflective material layer being formed to cover a region having the plurality of insulating blocks and a region outside the plurality of insulating blocks; and removing the insulating layer; wherein a portion of the reflective material layer on a side of the plurality of insulating blocks distal to the base substrate is removed together with the insulating layer, thereby forming a reflective layer.

Optionally, the method further comprises forming a mold; embossing a light transmission main body using the mold; and separating the mold from the light transmission main body to form the light transmission layer having the plurality of protrusions on the base substrate.

Optionally, forming the mold comprises forming a replication master layer on a second base substrate, the replication master layer is formed to include a plurality of replication masters corresponding to the plurality of protrusions to be formed in the optical modulating device; forming a conductive surface on an exposed surface of the replication master layer and the second base substrate; forming a metal layer on the conductive surface; and separating the metal layer from the replication master layer and the second base substrate, thereby forming the mold.

Optionally, embossing the light transmission main body comprises embossing the light transmission main body using the mold, thereby forming a light transmission layer having a plurality of protrusions on a base substrate, and a plurality of recesses, each of which on a side of one of the plurality of protrusions distal to the base substrate.

Optionally, prior to forming the reflective layer, further comprising forming an insulating layer having a plurality of insulating blocks, each of which on a side of one of the plurality of protrusions distal to the base substrate; wherein forming the insulating layer comprises printing an ink in the plurality of recesses on a side of the plurality of protrusions distal to the base substrate; and curing the ink in the plurality of recesses on a side of the plurality of protrusions distal to the base substrate, thereby forming the insulating layer having a plurality of insulating blocks, each of which in one of the plurality of recesses.

Optionally, forming the light transmission layer comprises forming the plurality of protrusions and the base substrate as an integral structure.

Optionally, forming the reflective layer comprises forming a reflective material layer throughout the light transmission layer, the reflective material layer being formed to cover a region having the plurality of protrusions and a region outside the plurality of protrusions; and removing a portion of the reflective material layer on a side of the plurality of insulating blocks distal to the base substrate thereby forming the reflective layer.

BRIEF DESCRIPTION OF THE FIGURES

The following drawings are merely examples for illustrative purposes according to various disclosed embodiments and are not intended to limit the scope of the present invention.

FIG. 6 is a flow chart illustrating a process of fabricating an optical modulating device in some embodiments according to the present disclosure.

FIG. 7 is a flow chart illustrating a process of fabricating an optical modulating device in some embodiments according to the present disclosure.

DETAILED DESCRIPTION

The disclosure will now be described more specifically with reference to the following embodiments. It is to be noted that the following descriptions of some embodiments are presented herein for purpose of illustration and description only. It is not intended to be exhaustive or to be limited to the precise form disclosed.

The present disclosure provides, inter alia, an optical modulating device, a back light module, a display apparatus, and a method of fabricating an optical modulating device that substantially obviate one or more of the problems due to limitations and disadvantages of the related art. In one aspect, the present disclosure provides an optical modulating device having a light transmissive region and a light blocking region. In some embodiments, the optical modulating device includes a base substrate; a plurality of protrusions on the base substrate in the light transmissive region and configured to allow light emitting out of a side of the optical modulating device; and a reflective layer on the base substrate in the light blocking region and configured to block light from emitting out of the side of the optical modulating device.

Figure 1A:
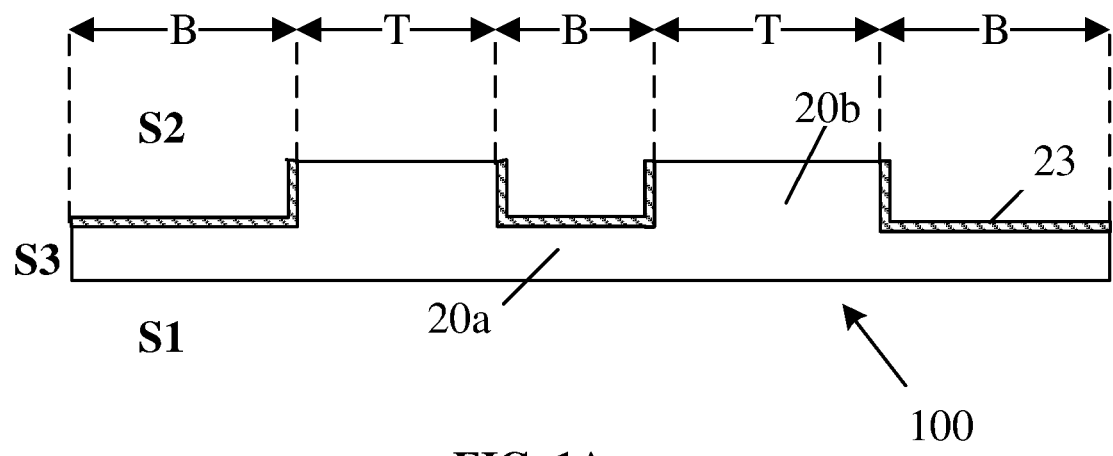
FIG. 1A is a schematic diagram illustrating the structure of an optical modulating device in some embodiments according to the present disclosure.
Figure 1B:
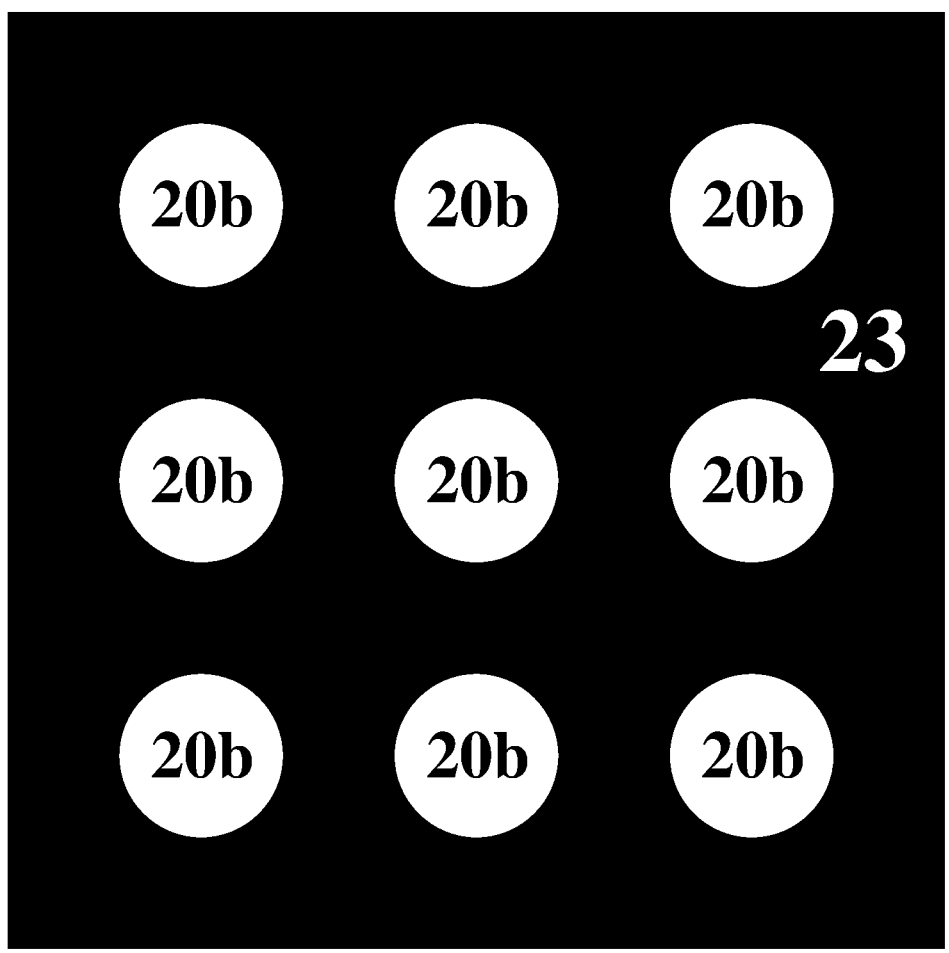
FIG. 1B is a plan view of the optical modulating device in FIG. 1A.

FIG. 1A is a schematic diagram illustrating the structure of an optical modulating device in some embodiments according to the present disclosure. FIG. 1B is a plan view of the optical modulating device in FIG. 1A. Referring to FIG. 1A and FIG. 1B, the optical modulating device 100 in some embodiments has a first side S1 (e.g., a bottom side), a second side S2 (e.g., a top side) substantially opposite to the first side S1, and a third side S3 (e.g., a lateral side) connecting the first side S1 and the second side S2. In some embodiments, the second side S2 is a light emitting side of the optical modulating device 100, e.g., light emits out of the optical modulating device 100 from the second side S2. The optical modulating device 100 in some embodiments has a light transmissive region T and a light blocking region B. Light emits out of the optical modulating device 100 from the light transmissive region T on the second side S2, and light is substantially blocked in the light blocking region B on the second side S2. Optionally, at least a portion of the first side S1 is substantially light transmissive, and light from one or more light sources enters the optical modulating device 100 from the first side S1 (direct-lit type). Optionally, at least a portion of the third side S3 is substantially light transmissive, and light from one or more light sources enters the optical modulating device 100 from the third side S3 (edge-lit type).

In some embodiments, the optical modulating device 100 includes a base substrate 20a, a plurality of protrusions 20b on the base substrate 20a in the light transmissive region T and configured to allow light emitting out of the second side S2, and a reflective layer 23 on the base substrate 20a in the light blocking region B and configured to block light from emitting out of the second side S2. Optionally, the base substrate 20a and the plurality of protrusions 20b constitute an integral structure. Optionally, the base substrate 20a and the plurality of protrusions 20b are made of a substantially transparent material. As used herein, the term "substantially transparent" means at least 50 percent (e.g., at least 60 percent, at least 70 percent, at least 80 percent, at least 90 percent, and at least 95 percent) of light in the visible wavelength range transmitted therethrough. Optionally, the plurality of protrusions 20b are spaced apart from each other by the reflective layer 23. As shown in FIG. 1A and FIG. 1B, in some embodiments, the reflective layer 23 corresponds to the light blocking region B, and the plurality of protrusions 20b correspond to the light transmissive region T.

Optionally, the plurality of protrusions 20b are a plurality of nanoscale protrusions. As used herein, the term "nanoscale" refers to structures having sizes or dimensions (e.g., diameters) no greater than 1000 nanometers (nm), e.g., in a range of approximately 10 nm to approximately 1000 nm, approximately 10 nm to approximately 100 nm, approximately 100 nm to approximately 200 an, approximately 200 urn to approximately 300 an, approximately 300 nm to approximately 400 nm, approximately 400 nm to approximately 500 nm, approximately 500 nm to approximately 600 nm, approximately 600 nm to approximately 700 nm, approximately 700 nm to approximately 800 nm, approximately 800 n to approximately 900 nm, approximately 900 nm to approximately 1000 nm.

Figure 2:
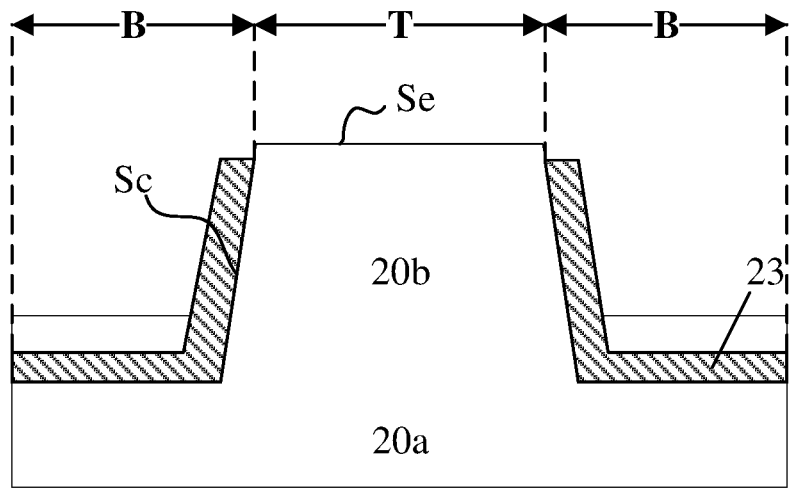
FIG. 2 is a zoom-in view of one of the plurality of protrusions in an optical modulating device in some embodiments according to the present disclosure.

FIG. 2 is a zoom-in view of one of the plurality of protrusions in an optical modulating device in some embodiments according to the present disclosure. Referring to FIG. 2, each of the plurality of protrusions 20b in some embodiments has an exposed surface Se on which the reflective layer 23 is absent, and a covered surface Sc on which the reflective layer 23 is present. Optionally, the covered surface Sc is a lateral surface of each of the plurality of protrusions 20b, the covered surface Sc connecting the exposed surface Se with the base substrate 20a. The exposed surface Se is in the light transmissive region T, and the covered surface Sc is in the light blocking region B. By having the reflective layer 23 at least partially covers the lateral surface of the plurality of protrusions 20b, the light emitted from the optical modulating device can be further aligned.

In some embodiments, an orthographic projection of the plurality of protrusions 20b on the base substrate 20a is at least partially non-overlapping with an orthographic projection of the reflective layer 23 on the base substrate 20a. Optionally, the orthographic projection of the plurality of protrusions 20b on the base substrate 20a is substantially non-overlapping with the orthographic projection of the reflective layer 23 on the base substrate 20a. Optionally, an orthographic projection of the exposed surface Se of the plurality of protrusions 20b on the base substrate 20a is substantially non-overlapping with the orthographic projection of the reflective layer 23 on the base substrate 20a.

Various appropriate shapes may be adopted for the plurality of protrusions 20b. Examples of appropriate shapes for the plurality of protrusions 20b include a cylinder, a truncated cylinder, a domed cylinder, a sphere, a hemisphere, a sub-hemisphere, a cube, a cuboid, a pyramid, a cone, a truncated cone, a triangular prism, a barrel, and so on.

Various appropriate reflective materials and various appropriate fabricating methods may be used for making the reflective layer 23. Examples of appropriate reflective materials for making the reflective layer 23 include metals having high reflectivity such as silver and aluminum.

Optionally, the optical modulating device 100 is a light guide plate. Optionally, the second side S2 of the optical modulating device 100 is a light emitting side of the optical modulating device 100 for providing a back light for a display panel. Optionally, one or more light sources may be disposed on the first side S1 or on the third side S3, or both.

In some embodiments, and as shown in FIG. 1A and FIG. 2, the plurality of protrusions 20b have a substantially leveled surface.

Figure 3:
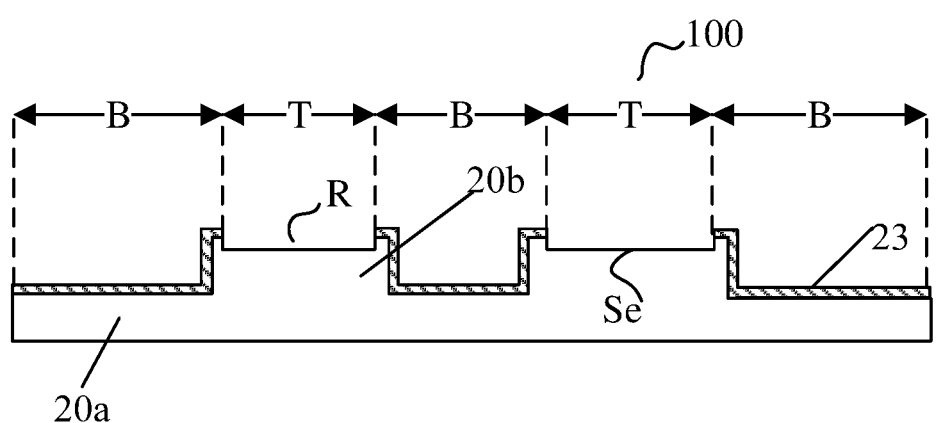
FIG. 3 is a schematic diagram illustrating the structure of an optical modulating device in some embodiments according to the present disclosure.

FIG. 3 is a schematic diagram illustrating the structure of an optical modulating device in some embodiments according to the present disclosure. Referring to FIG. 3, the optical modulating device 100 in some embodiments further includes a plurality of recesses R in the light transmissive region T, each of which on a side of one of the plurality of protrusions 20b distal to the base substrate 20a. An orthographic projection of the plurality of recesses R on the base substrate 20a is at least partially non-overlapping with an orthographic projection of the reflective layer 23 on the base substrate 20a. Optionally, the orthographic projection of the plurality of recesses R on the base substrate 20a is substantially non-overlapping with the orthographic projection of the reflective layer 23 on the base substrate 20a. Optionally, an orthographic projection of the exposed surface Se of the plurality of protrusions 20b on the base substrate 20a substantially overlaps with the orthographic projection of the plurality of recesses R on the base substrate 20a.

Optionally, the plurality of recesses R are a plurality of nanoscale recesses. Optionally, the plurality of recesses R have sizes or dimensions (e.g., diameters) no greater than 1000 nanometers (nm), e.g., in a range of approximately 10 nm to approximately 1000 nm, approximately 10 nm to approximately 100 nm, approximately 100 nm to approximately 200 nm, approximately 200 nm to approximately 300 nm, approximately 300 urn to approximately 400 nm, approximately 400 nm to approximately 500 nm, approximately 500 nm to approximately 600 nm, approximately 600 urn to approximately 700 nm, approximately 700 urn to approximately 800 nm, approximately 800 n to approximately 900 nm, approximately 900 nm to approximately 1000 nm.

Figure 4:
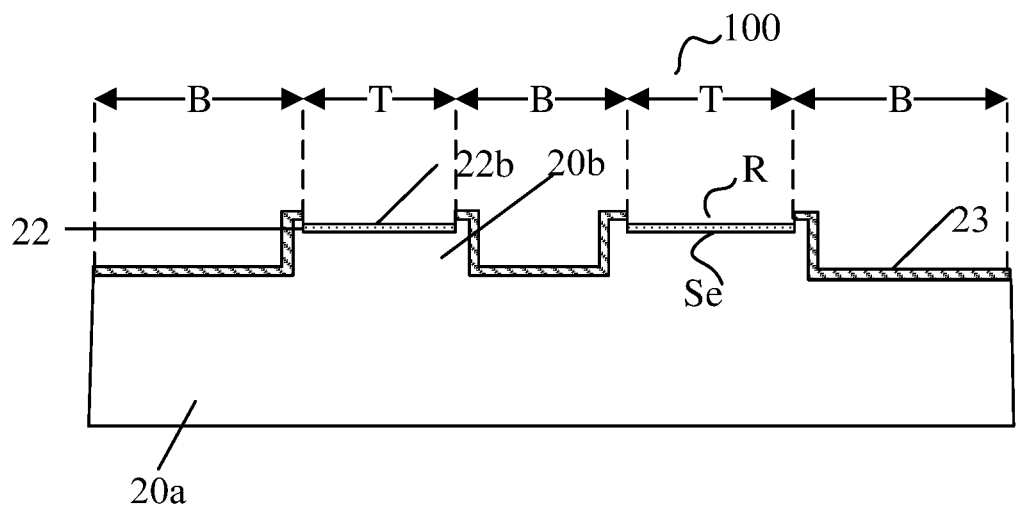
FIG. 4 is a schematic diagram illustrating the structure of an optical modulating device in some embodiments according to the present disclosure.

FIG. 4 is a schematic diagram illustrating the structure of an optical modulating device in some embodiments according to the present disclosure. Referring to FIG. 4, the optical modulating device 100 in some embodiments further includes an insulating layer 22 on a side of the plurality of protrusions 20b distal to the base substrate 20a. The insulating layer 22 includes a plurality of insulating blocks 22b, each of which in one of the plurality of recesses R and in the light transmissive region T. Optionally, the insulating layer 22 is made of a substantially transparent material. Optionally, an orthographic projection of the plurality of insulating blocks 22b on the base substrate 20a is at least partially non-overlapping with an orthographic projection of the reflective layer 23 on the base substrate 20a. Optionally, the orthographic projection of the plurality of insulating blocks 22b on the base substrate 20a is substantially non-overlapping with the orthographic projection of the reflective layer 23 on the base substrate 20a. Optionally, an orthographic projection of the exposed surface Se of the plurality of protrusions 20b on the base substrate 20a substantially overlaps with the orthographic projection of the plurality of insulating blocks 22b on the base substrate 20a.

Optionally, the plurality of insulating blocks 22b are a plurality of nanoscale insulating blocks. Optionally, the plurality of insulating blocks 22b have sizes or dimensions (e.g., diameters) no greater than 1000 nanometers (nm), e.g., in a range of approximately 10 nm to approximately 1000 nm, approximately 10 nm to approximately 100 nm, approximately 100 nm to approximately 200 in, approximately 200 nm to approximately 300 nm, approximately 300 nm to approximately 400 in, approximately 400 nm to approximately 500 nm, approximately 500 nm to approximately 600 nm, approximately 600 nm to approximately 700 n, approximately 700 nm to approximately 800 nm, approximately 800 nm to approximately 900 nm, approximately 900 m to approximately 1000 nm.

In another aspect, the present disclosure provides a method of fabricating an optical modulating device having a light transmissive region and a light blocking region. The optical modulating device is fabricated to have a first side (e.g., a bottom side), a second side (e.g., a top side) substantially opposite to the first side, and a third side (e.g., a lateral side) connecting the first side and the second side. In some embodiments, the second side is a light emitting side of the optical modulating device, e.g., light emits out of the optical modulating device from the second side. Light emits out of the optical modulating device from the light transmissive region on the second side, and light is substantially blocked in the light blocking region on the second side.

In some embodiments, the method includes forming a light transmission layer having a plurality of protrusions in the light transmissive region and configured to allow light emitting out of the plurality of protrusions, and forming a reflective layer on the base substrate in the light blocking region and configured to block light from emitting out of the light transmission layer. Optionally, the base substrate and the plurality of protrusions are formed as an integral structure. Optionally, the base substrate and the plurality of protrusions are made of a substantially transparent material. Optionally, the plurality of protrusions are formed to be spaced apart from each other by the reflective layer. Optionally, the reflective layer is formed in the light blocking region, and the plurality of protrusions are formed in the light transmissive region.

Figure 5A:
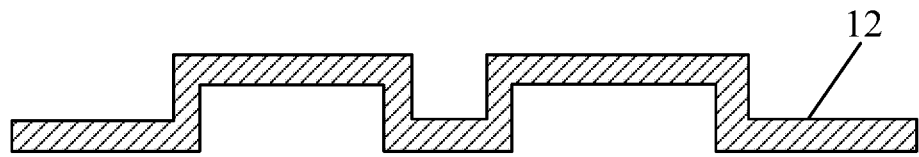
FIGS. 5A to 5D illustrate a process of fabricating an optical modulating device in some embodiments according to the present disclosure.
Figure 5B:
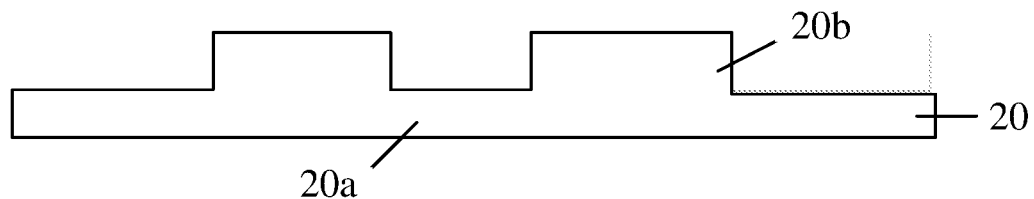
Figure 5C:
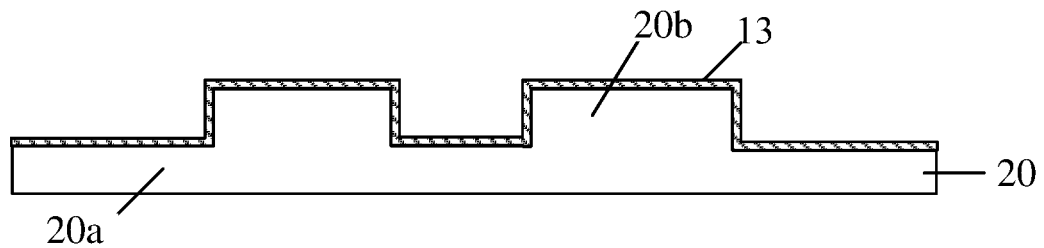
Figure 5D:
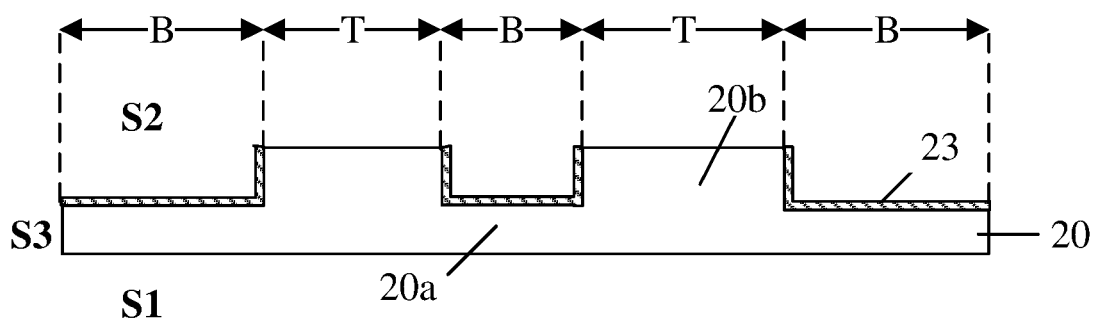

FIGS. 5A to 5D illustrate a process of fabricating an optical modulating device in some embodiments according to the present disclosure. Referring to FIG. 5A to FIG. 5D, the method in some embodiments includes forming a mold 12 (FIG. 5A), embossing a light transmission main body using the mold 12 and separating the mold 12 from the light transmission main body to form a light transmission layer 20 having a plurality of protrusions 20b on a base substrate 20a (FIG. 5B), forming a reflective material layer 13 on the light transmission layer 20 having the plurality of protrusions 20b and the base substrate 20a (FIG. 5C), and removing a portion of the reflective material layer 13 on the plurality of protrusions 20b to form a reflective layer 23 (FIG. 5D). The reflective layer 23 is formed in the light blocking region B and configured to block light from emitting out of the second side S2.

FIG. 6 is a flow chart illustrating a process of fabricating an optical modulating device in some embodiments according to the present disclosure. Referring to FIG. 6, the method in some embodiments includes forming a light transmission layer having a base substrate and a plurality of protrusions on the base substrate, the plurality of protrusions being a plurality of nanoscale protrusions spaced apart from each other and being light transmissive; forming an insulating layer having a plurality of insulating blocks, each of which on a side of one of the plurality of protrusions distal to the base substrate; and forming a reflective layer on the base substrate in a region outside the plurality of insulating blocks. Optionally, the reflective layer is made of a metallic material.

By first forming an insulating layer covering a top surface of the plurality of protrusions, the reflective layer can be formed only in a region outside the top surface of the plurality of protrusions. In one example, by first forming the insulating layer covering the top surface of the plurality of protrusions, the reflective material is not deposited on the top surface of the plurality of protrusions at all. For example, the surface of the light transmission layer can be treated to become conductive prior to forming the insulating layer, followed by forming the plurality of insulating blocks on top of the plurality of protrusions. Subsequently, the reflective material is deposited on the conductive surface by, e.g., electrodeposition. Because the top surface of the plurality of protrusions are covered by the plurality of insulating blocks which is not conductive, the reflective material is not deposited on the plurality of insulating blocks. In another example, the insulating layer is first formed to cover the top surface of the plurality of protrusions, a reflective material layer is then formed throughout the surface of the light transmission layer, the plurality of insulating blocked is then removed subsequent to forming the reflective material layer. A portion of the reflective material layer on top of the plurality of insulating blocks is also removed during the process of removing the plurality of insulating blocks, thereby forming the reflective layer. The reflective layer so formed does not cover the top surface of the plurality of protrusions.

Optionally, each of the plurality of protrusions is formed to have an exposed on which the reflective layer is absent, and a covered surface on which the reflective layer 23 is present. Optionally, the exposed surface is a top surface of each of the plurality of protrusions. Optionally, the covered surface is a lateral surface of each of the plurality of protrusions, the covered surface connecting the exposed surface with the base substrate. The exposed surface is formed in the light transmissive region, and the covered surface is formed in the light blocking region. By having the reflective layer at least partially covers the lateral surface of the plurality of protrusions, the light emitted from the optical modulating device can be further aligned.

The plurality of protrusions may be formed to have various appropriate shapes. Examples of appropriate shapes for the plurality of protrusions include a cylinder, a truncated cylinder, a domed cylinder, a sphere, a hemisphere, a sub-hemisphere, a cube, a cuboid, a pyramid, a cone, a truncated cone, a triangular prism, a barrel, and so on.

FIG. 7 is a flow chart illustrating a process of fabricating an optical modulating device in some embodiments according to the present disclosure. FIGS. 8A to 8H illustrate a process of fabricating an optical modulating device in some embodiments according to the present disclosure. Referring to FIG. 8E, the method in some embodiments includes forming a light transmission layer 20 having a base substrate 20a and a plurality of protrusions 20b on the base substrate 20a. The plurality of protrusions 20b are formed as a plurality of nanoscale protrusions spaced apart from each other and are light transmissive. As shown in FIG. 8E, the light transmission layer 20 is formed to have a plurality of recesses R respectively, each of which on a side of one of the plurality of protrusions 20b distal to the base substrate 20a. The plurality of recesses R may be formed to have various appropriate shapes configured to contain a liquid. Optionally, the optical modulating device is made of a polymer material. Optionally, the light transmission layer 20 is formed using an embossing process.

Figure 8A:
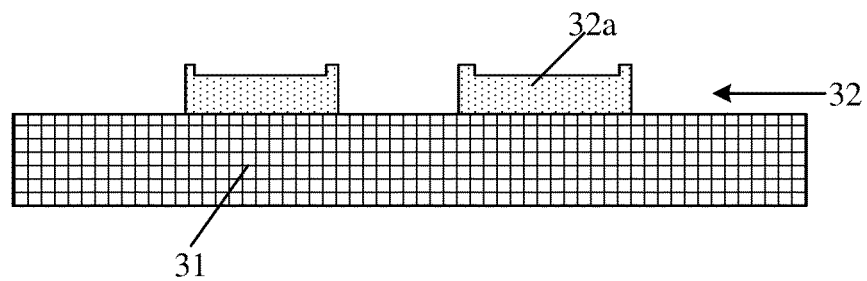
FIGS. 8A to 8H illustrate a process of fabricating an optical modulating device in some embodiments according to the present disclosure.
Figure 8B:
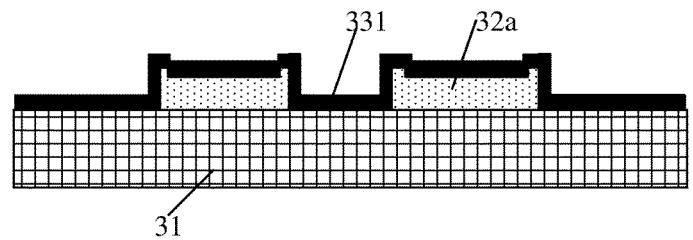
Figure 8C:

Referring to FIG. 8C, the method in some embodiments includes forming a mold 33. Referring to FIG. 7, the step of forming the mold in some embodiments includes forming a replication master layer 32 on a second base substrate 31, the replication master layer 32 is formed to include a plurality of replication masters 32a corresponding to the plurality of protrusions to be formed in the optical modulating device. Optionally, the plurality of replication masters 32a are equivalent to the plurality of protrusions in terms of size, dimension, and shape. Optionally, a photoresist layer is first formed on the second base substrate 31, followed by exposure and development, thereby forming the replication master layer 32. Referring to FIG. 7, the step of forming the mold in some embodiments further includes forming a conductive surface on an exposed surface of the replication master layer 32 and the second base substrate 31. For example, the conductive surface is formed on the top surface and the lateral surface of each of the plurality of replication masters 32a, and is formed on the second base substrate 31 in a region not covered by the plurality of replication masters 32a. Referring to FIG. 7, the step of forming the mold in some embodiments further includes forming a metal layer 331 on the conductive surface (see, e.g., FIG. 8B). Optionally, the metal layer 331 includes nickel. Referring to FIG. 7, the step of forming the mold in some embodiments further includes separating the metal layer 331 from the replication master layer 32 and the second base substrate 31, thereby forming a mold 33 (see, e.g., FIG. 8C).

Referring to FIG. 7, the method in some embodiments further includes providing a light transmission main body 34. Optionally, the light transmission main body 34 is made of a polymer material.

Figure 8D:
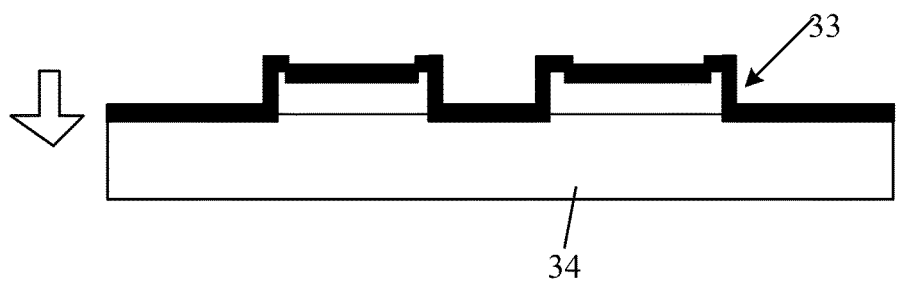
Figure 8E:
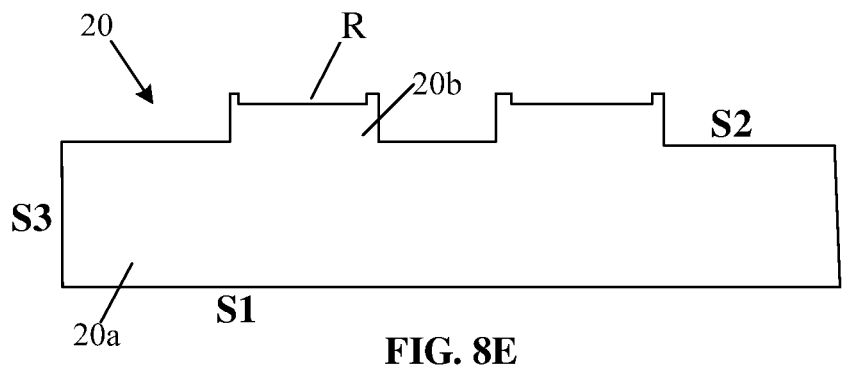
Figure 8F:
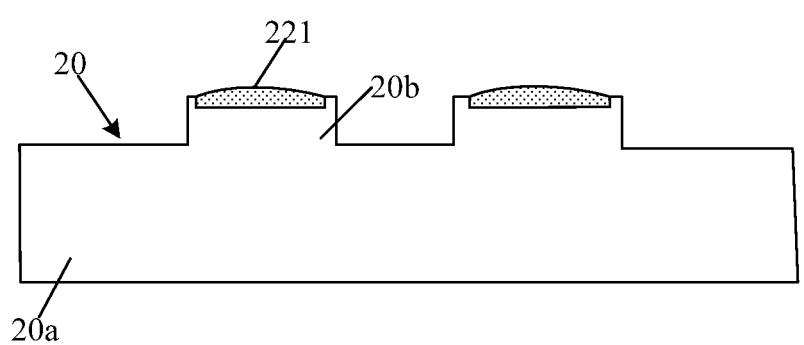

Referring to FIG. 7, the method in some embodiments further includes embossing the light transmission main body 34 using the mold 33, thereby forming a light transmission layer 20 having a plurality of protrusions 20b on a base substrate 20a, and a plurality of recesses R, each of which on a side of one of the plurality of protrusions 20b distal to the base substrate 20a (see, e.g., FIG. 8D and FIG. 8E).

Referring to FIG. 7, the method in some embodiments further includes forming a conductive surface on an exposed surface of the light transmission layer 20 on a side having the plurality of protrusions 20b on the base substrate 20a. Referring to FIG. 8E, the light transmission layer 20 in some embodiments has a first side S1 (e.g., a bottom side), a second side S2 (e.g., a top side) substantially opposite to the first side S1, and a third side S3 (e.g., a lateral side) connecting the first side S and the second side S2. The plurality of protrusions 20b are formed on the second side S2 of the light transmission layer 20. Optionally, the conductive surface is formed on the exposed surface of the second side S2 of the light transmission layer 20.

In some embodiments, the method further includes forming an insulating layer 22 on a side of the plurality of protrusions 20b distal to the base substrate 20a. The insulating layer 22 is formed to include a plurality of insulating blocks 22b, each of which on a side of one of the plurality of protrusions 20b distal to the base substrate 20a (see. e.g., FIG. 8G). Referring to FIG. 7, the step of forming the insulating layer 22 in some embodiments includes printing an ink 221 in the plurality of recesses R on a side of the plurality of protrusions 20b distal to the base substrate 20a (see, e.g., FIG. 8F).

Figure 8G:
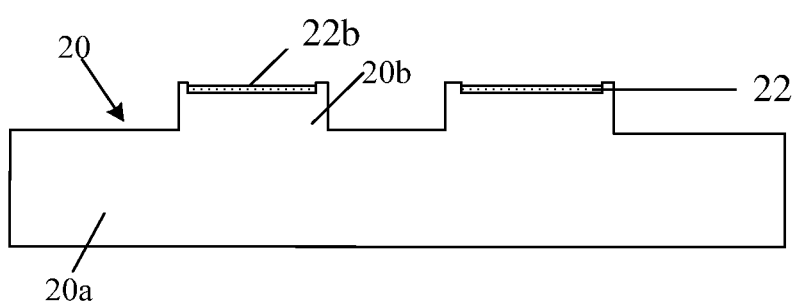
Figure 8H:
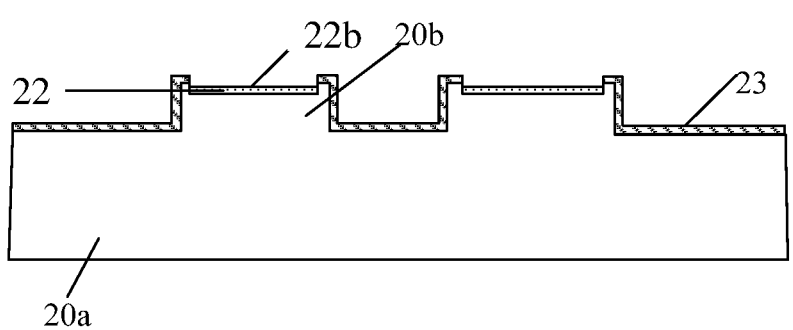

Referring to FIG. 7, the step of forming the insulating layer 22 in some embodiments further includes curing the ink 221 in the plurality of recesses R on a side of the plurality of protrusions 20b distal to the base substrate 20a, thereby forming the insulating layer 22 having a plurality of insulating blocks 22b, each of which in one of the plurality of recesses R (see, e.g., FIG. 8G).

In some embodiments, the method further includes forming a reflective layer 23 on the base substrate 20a in a region outside the plurality of insulating blocks 22b. For example, the reflective layer 23 is formed on the base substrate 20a in a region not covered by the plurality of protrusions 20b and on a lateral surface of the plurality of protrusions 20b. Referring to FIG. 7, the step of forming the reflective layer 23 in some embodiments includes electrodepositing a reflective material on the base substrate 20a in a region outside the plurality of insulating blocks 22b thereby forming a reflective layer 23 (see. e.g., FIG. 8H). Because the surface of the light transmission layer 20 is treated to become conductive prior to forming the insulating layer 22, and the insulating layer 22 covers the top surface of the plurality of protrusions 20b, the step of electrodepositing the reflective material would not deposit the reflective material in the region having the insulating layer 22, i.e., the step of electrodepositing the reflective material would only deposit the reflective material on the base substrate 20a in a region not covered by the plurality of protrusions 20b and on a lateral surface of the plurality of protrusions 20b. Optionally, the step of electrodepositing the reflective material is performed by an electroforming process.

In some embodiments, the method further includes removing the insulating layer 22, e.g., by ashing.

In some embodiments, the insulating layer 22 is made of a substantially transparent material. Optionally, the insulating layer 22 is not removed, and remains in the optical modulating device.

Figure 9:
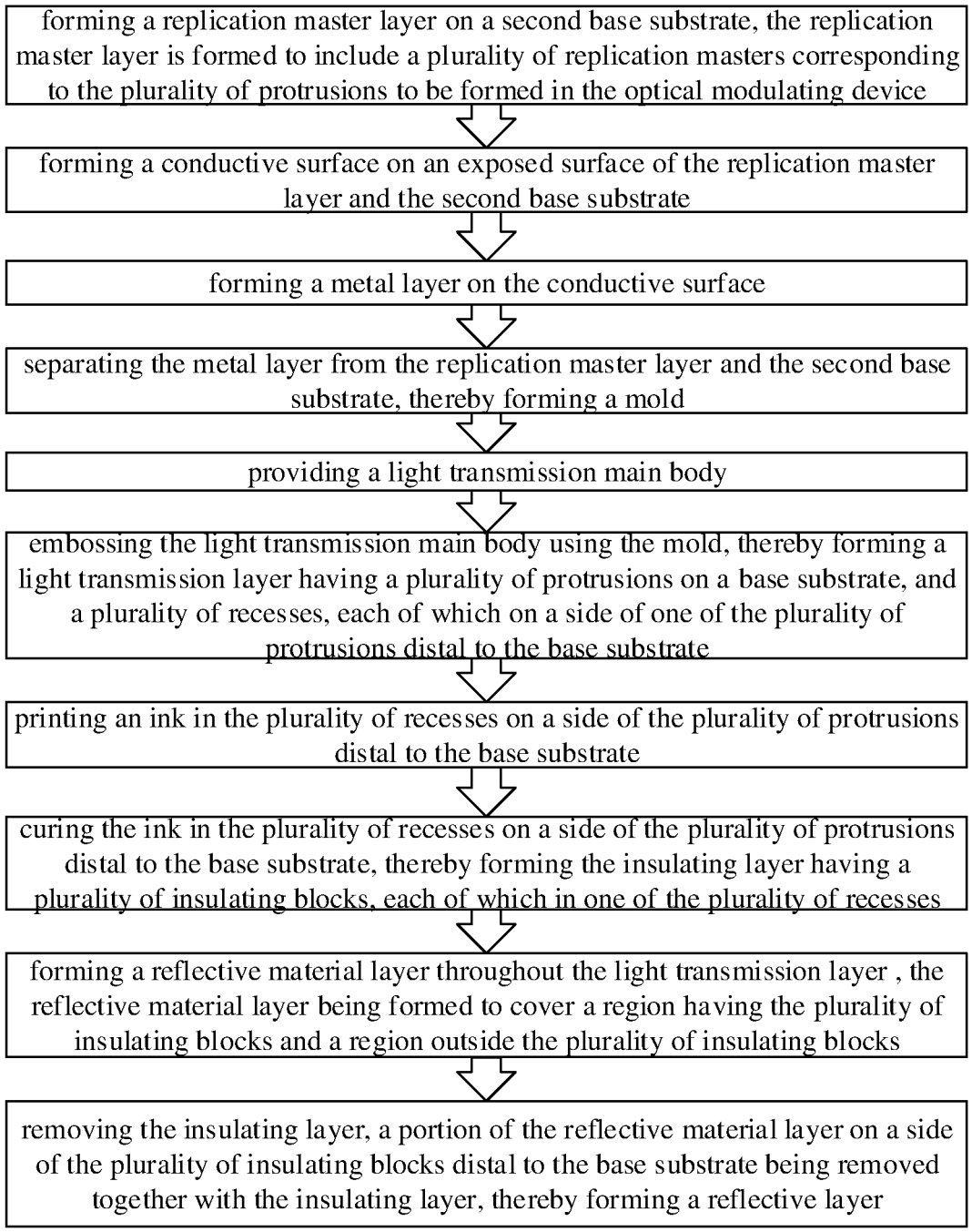
FIG. 9 is a flow chart illustrating a process of fabricating an optical modulating device in some embodiments according to the present disclosure.
Figure 10A:
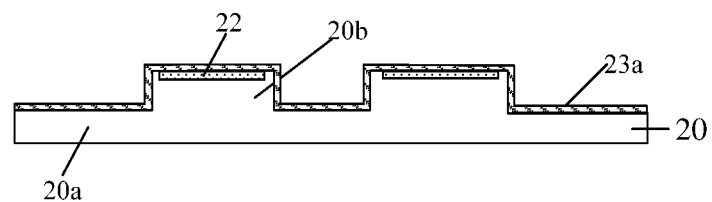
FIGS. 10A to 10B illustrate a process of fabricating an optical modulating device in some embodiments according to the present disclosure.
Figure 10B:
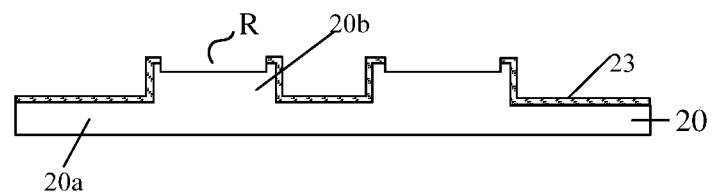

FIG. 9 is a flow chart illustrating a process of fabricating an optical modulating device in some embodiments according to the present disclosure. FIGS. 10A to 10B illustrate a process of fabricating an optical modulating device in some embodiments according to the present disclosure. Referring to FIG. 9, FIGS. 8A to 8G, and FIGS. 10A to 10B, the method in some embodiments includes forming a mold 33. Referring to FIG. 9 and FIGS. 8A to 8G, the step of forming the mold in some embodiments includes forming a replication master layer 32 on a second base substrate 31, the replication master layer 32 is formed to include a plurality of replication masters 32a corresponding to the plurality of protrusions to be formed in the optical modulating device; forming a conductive surface on an exposed surface of the replication master layer 32 and the second base substrate 31; and forming a metal layer 331 on the conductive surface.

Referring to FIG. 9 and FIGS. 8A to 8G, the method in some embodiments further includes providing a light transmission main body 34; embossing the light transmission main body 34 using the mold 33, thereby forming a light transmission layer 20 having a plurality of protrusions 20b on a base substrate 20a, and a plurality of recesses R, each of which on a side of one of the plurality of protrusions 20b distal to the base substrate 20a; forming a conductive surface on an exposed surface of the light transmission layer 20 on a side having the plurality of protrusions 20b on the base substrate 20a; and forming an insulating layer 22 on a side of the plurality of protrusions 20b distal to the base substrate 20a. The insulating layer 22 is formed to include a plurality of insulating blocks 22b, each of which on a side of one of the plurality of protrusions 20b distal to the base substrate 20a. Referring to FIG. 9 and FIGS. 8A to 8G, the step of forming the insulating layer 22 in some embodiments includes printing an ink 221 in the plurality of recesses R on a side of the plurality of protrusions 20b distal to the base substrate 20a; and curing the ink 221 in the plurality of recesses R on a side of the plurality of protrusions 20b distal to the base substrate 20a, thereby forming the insulating layer 22 having a plurality of insulating blocks 22b, each of which in one of the plurality of recesses R.

Referring to FIG. 9 and FIG. 10A, the method in some embodiments further includes forming a reflective material layer 23a throughout the light transmission layer 20, the reflective material layer 23a being formed to cover a region having the plurality of insulating blocks 22b and a region outside the plurality of insulating blocks 22b. Optionally, the reflective material layer 23a is forming by sputtering a reflective material on the light transmission layer 20.

the plurality of insulating blocked is then removed subsequent to forming the reflective material layer. A portion of the reflective material layer on top of the plurality of insulating blocks is also removed during the process of removing the plurality of insulating blocks, thereby forming the reflective layer. The reflective layer so formed does not cover the top surface of the plurality of protrusions Referring to FIG. 9 and FIG. 10B, the method in some embodiments further includes removing the insulating layer 22, a portion of the reflective material layer 23a on a side of the plurality of insulating blocks 22b distal to the base substrate 20a being removed together with the insulating layer 22, thereby forming a reflective layer 23. Optionally, the step of removing the insulating layer is performed by photodecomposition. Optionally, the step of removing the insulating layer is performed by a lift-off process using a solvent.

In another aspect, the present disclosure provides a back light module having the optical modulating device described herein or fabricated by a method described herein. Optionally, the optical modulating device is a light guide plate in the back light module. The present optical modulating device significantly improves the alignment of light emitted from the back light module. As a result, light utilization rate of the back light module can be substantially enhanced by having the present optical modulating device.

In another aspect, the present disclosure provides a display apparatus having the back light module described herein. Examples of appropriate touch control display apparatuses include, but are not limited to, an electronic paper, a mobile phone, a tablet computer, a television, a monitor, a notebook computer, a digital album, a GPS, etc.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention". "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A back light module, comprising an optical modulating device having a light transmissive region and a light blocking region, and one or more light sources;

wherein the optical modulating device comprises:

a base substrate;

a plurality of protrusions on the base substrate in the light transmissive region and configured to allow light, emitted from the one or more light sources and transmitted through the base substrate, emitting out of a protruding side of the optical modulating device;

a reflective layer on the base substrate in the light blocking region and configured to block light, emitted from the one or more light sources and transmitted through the base substrate, from emitting out of the protruding side of the optical modulating device;

a plurality of recesses in the light transmissive region; and an insulating layer comprising a plurality of insulating blocks;

wherein a respective one of the plurality of protrusions protrudes away from the base substrate toward the protruding side; and the one or more light sources are on a side of the optical modulating device other than the protruding side;

wherein the respective one of the plurality of protrusions has a first surface on which the reflective layer is absent and a second surface on which the reflective layer is present;

the first surface is in the light transmissive region; and the second surface and a surface of the base substrate between adjacent protrusions of the plurality of protrusions are in the light blocking region;

wherein a respective one of the plurality of recesses and a respective one of the plurality of insulating blocks are successively on a side of the respective one of the plurality of protrusions distal to the base substrate, configured to allow the light from the one or more light sources emitting sequentially from the respective one of the plurality of protrusions, through the respective one of the plurality of recesses and the respective one of the plurality of insulating blocks, then out of the protruding side of the optical modulating device;

the respective one of the plurality of insulating blocks is at least partially in the respective one of the plurality of recesses and in direct contact with a top portion of the respective one of the plurality of protrusions and not in contact with the base substrate;

an orthographic projection of the plurality of recesses on the base substrate is substantially non-overlapping with an orthographic projection of the reflective layer on the base substrate; and an orthographic projection of the respective one of the plurality of insulating blocks on the base substrate is substantially non-overlapping with the orthographic projection of the reflective layer on the base substrate.

2. The back light module of claim 1, wherein the second surface connecting the first surface with the base substrate; and the reflective layer is on the second surface and the surface of the base substrate between adjacent protrusions of the plurality of protrusions.

3. The back light module of claim 1, wherein an orthographic projection of the plurality of protrusions on the base substrate is at least partially non-overlapping with the orthographic projection of the reflective layer on the base substrate; and an orthographic projection of the first surface of the plurality of protrusions on the base substrate is substantially non-overlapping with the orthographic projection of the reflective layer on the base substrate.

4. The back light module of claim 1, wherein the base substrate and the plurality of protrusions are formed as an integral light transmission layer.

5. The back light module of claim 1, wherein the plurality of protrusions are a plurality of nanoscale protrusions.

6. The back light module of claim 1, wherein the optical modulating device is a light guide plate.

7. The back light module of claim 1, wherein a cross-section of the respective one of the plurality of protrusions along a plane perpendicular to a surface of the base substrate and intersecting the adjacent protrusions of the plurality of protrusions has a first base in contact with the base substrate, a second base opposite to the first base, a first connecting side and a second connecting side respectively connecting the first base and the second base;

the second base forms a bottom of the respective one of the plurality of recesses, and is in contact with the respective one of the plurality of insulating blocks;

the respective one of the plurality of protrusions is configured to allow light emitted from the one or more light sources to sequentially transmit through the first base and the second base, through the respective one of the plurality of recesses and the respective one of the plurality of insulating blocks, then emit out of the protruding side of the optical modulating device; and the first connecting side and the second connecting side are at least partially covered by the reflective layer.

8. A display apparatus, comprising the back light module of claim 1, and a liquid crystal display panel configured to receive light emitted out of the protruding side of the optical modulating device.

9. A method of fabricating a back light module comprising an optical modulating device having a light transmissive region and a light blocking region, comprising:

forming a light transmission layer comprising a plurality of protrusions on a base substrate in the light transmissive region and configured to allow light, emitted from one or more light sources and transmitted through the base substrate, emitting out of a protruding side of the plurality of protrusions, wherein a respective one of the plurality of protrusions is formed to protrude away from the base substrate toward the protruding side;

forming an insulating layer having a plurality of insulating blocks, a respective one of the plurality of insulating blocks formed in direct contact with a top portion of the respective one of the plurality of protrusions;

forming a reflective layer on the base substrate in the light blocking region and configured to block light, emitted from the one or more light sources and transmitted through the base substrate, from emitting out of the light transmission layer;

providing one or more light sources on a side of the optical modulating device other than the protruding side;

forming a plurality of recesses in the light transmissive region; and forming an insulating layer comprising a plurality of insulating blocks;

wherein each of the plurality of protrusions is formed to have a first surface on which the reflective layer is absent and a second surface on which the reflective layer is present;

the first surface is in the light transmissive region; and the second surface and a surface of the base substrate between adjacent protrusions of the plurality of protrusions are in the light blocking region;

wherein forming the reflective layer comprises forming a reflective material layer, the reflective material layer is formed to be a unitary layer at least partially covering lateral surfaces of the plurality of protrusions and covering a surface of a portion of the light transmission layer between adjacent protrusions of the plurality of protrusions, the reflective material layer is at least partially absent on surfaces of top portions of the plurality of protrusions;

a respective one of the plurality of recesses and a respective one of the plurality of insulating blocks are successively on a side of the respective one of the plurality of protrusions distal to the base substrate, configured to allow the light from the one or more light sources emitting sequentially from the respective one of the plurality of protrusions, through the respective one of the plurality of recesses and the respective one of the plurality of insulating blocks, then out of the protruding side of the optical modulating device;

the respective one of the plurality of insulating blocks is at least partially in the respective one of the plurality of recesses and in direct contact with a top portion of the respective one of the plurality of protrusions and not in contact with the base substrate;

an orthographic projection of the plurality of recesses on the base substrate is substantially non-overlapping with an orthographic projection of the reflective layer on the base substrate; and an orthographic projection of the respective one of the plurality of insulating blocks on the base substrate is substantially non-overlapping with the orthographic projection of the reflective layer on the base substrate.

10. The method of claim 9, wherein forming the reflective material layer comprises electrodepositing a reflective material at least partially covering the lateral surfaces of the plurality of protrusions and covering the surface of the portion of the light transmission layer between adjacent protrusions of the plurality of protrusions, the reflective material being electrodeposited in a region outside the plurality of insulating blocks.

11. The method of claim 10, wherein electrodepositing the reflective material is performed by an electroforming process.

12. The method of claim 9, further comprising:

forming a mold;

embossing a light transmission main body using the mold; and separating the mold from the light transmission main body to form the light transmission layer having the plurality of protrusions on the base substrate.

13. The method of claim 12, wherein forming the mold comprises:

forming a replication master layer on a second base substrate, the replication master layer is formed to include a plurality of replication masters corresponding to the plurality of protrusions to be formed in the optical modulating device;

forming a conductive surface on an exposed surface of the replication master layer and the second base substrate;

forming a metal layer on the conductive surface; and separating the metal layer from the replication master layer and the second base substrate, thereby forming the mold.

14. The method of claim 12, wherein embossing the light transmission main body comprises:

embossing the light transmission main body using the mold, thereby forming a light transmission layer having the plurality of protrusions on a base substrate, and the plurality of recesses, the respective one of the plurality of recesses being on side of the respective one of the plurality of protrusions distal to the base substrate, configured to allow the light from the one or more light sources emitting sequentially from the respective one of the plurality of protrusions, through the respective one of the plurality of recesses, and out of the protruding side of the optical modulating device.

15. The method of claim 9, wherein forming the light transmission layer comprises forming the plurality of protrusions and the base substrate as an integral structure.

16. A method of fabricating a back light module comprising an optical modulating device having a light transmissive region and a light blocking region, comprising:

forming a light transmission layer comprising a plurality of protrusions on a base substrate in the light transmissive region and configured to allow light, emitted from one or more light sources and transmitted through the base substrate, emitting out of a protruding side of the plurality of protrusions, wherein a respective one of the plurality of protrusions is formed to protrude away from the base substrate toward the protruding side;

forming an insulating layer having a plurality of insulating blocks, a respective one of the plurality of insulating blocks formed in direct contact with a top portion of the respective one of the plurality of protrusions;

forming a reflective layer on the base substrate in the light blocking region and configured to block light, emitted from the one or more light sources and transmitted through the base substrate, from emitting out of the light transmission layer;

providing one or more light sources on a side of the optical modulating device other than the protruding side;

forming a mold;

embossing a light transmission main body using the mold; and separating the mold from the light transmission main body to form the light transmission layer having the plurality of protrusions on the base substrate, wherein each of the plurality of protrusions is formed to have a first surface on which the reflective layer is absent and a second surface on which the reflective layer is present;

the first surface is in the light transmissive region; and the second surface and a surface of the base substrate between adjacent protrusions of the plurality of protrusions are in the light blocking region;

wherein forming the reflective layer comprises forming a reflective material layer, the reflective material layer is formed to be a unitary layer at least partially covering lateral surfaces of the plurality of protrusions and covering a surface of a portion of the light transmission layer between adjacent protrusions of the plurality of protrusions, the reflective material layer is at least partially absent on surfaces of top portions of the plurality of protrusions;

wherein embossing the light transmission main body comprises:

embossing the light transmission main body using the mold, thereby forming a light transmission layer having the plurality of protrusions on a base substrate, and the plurality of recesses, the respective one of the plurality of recesses being on side of the respective one of the plurality of protrusions distal to the base substrate, configured to allow the light from the one or more light sources emitting sequentially from the respective one of the plurality of protrusions, through the respective one of the plurality of recesses, and out of the protruding side of the optical modulating device;

wherein prior to forming the reflective layer, further comprising forming an insulating layer having the plurality of insulating blocks, a respective one of which on a side of the respective one of the plurality of protrusions distal to the base substrate;

wherein forming the insulating layer comprises:

printing an ink in the plurality of recesses on a side of the plurality of protrusions distal to the base substrate; and curing the ink in the plurality of recesses on a side of the plurality of protrusions distal to the base substrate, thereby forming the insulating layer having a plurality of insulating blocks, the respective one of the plurality of insulating blocks being in the respective one of the plurality of recesses, configured to allow the light from the one or more light sources emitting sequentially from the respective one of the plurality of protrusions, through the respective one of the plurality of insulating blocks, and out of the protruding side of the optical modulating device.

* * * * *